United States Patent [19]

Shiobara et al.

[11] Patent Number: 5,418,266
[45] Date of Patent: * May 23, 1995

[54] EPOXY RESIN COMPOSITIONS AND SEMICONDUCTOR DEVICES ENCAPSULATED THEREWITH

[75] Inventors: Toshio Shiobara; Takayuki Aoki, both of Annaka; Kazutoshi Tomiyoshi, Takasaki, all of Japan

[73] Assignee: Shin-Etsu Chemical Co., Ltd., Tokyo, Japan

[*] Notice: The portion of the term of this patent subsequent to Mar. 2, 2010 has been disclaimed.

[21] Appl. No.: 187,262

[22] Filed: Jan. 27, 1994

Related U.S. Application Data

[63] Continuation of Ser. No. 858,458, Mar. 27, 1992, abandoned.

[30] Foreign Application Priority Data

Mar. 29, 1991 [JP] Japan ................... 3-91475

[51] Int. Cl.$^6$ ................... C08L 63/00
[52] U.S. Cl. ................... 523/443; 523/466; 525/481; 525/482; 525/534; 528/97; 257/793
[58] Field of Search ................ 523/443, 466; 525/481, 525/482, 534; 528/97

[56] References Cited

U.S. PATENT DOCUMENTS

| | | | |
|---|---|---|---|
| 3,275,708 | 9/1966 | Bylsma | 528/102 |
| 3,384,618 | 5/1968 | Imoto et al. | 528/151 |
| 4,551,508 | 11/1985 | Urasaki | 525/507 |
| 4,859,722 | 8/1989 | Shiobara et al. | 523/436 |
| 4,877,822 | 10/1989 | Itoh et al. | 525/476 |
| 5,068,293 | 11/1991 | Kaji et al. | 528/97 |
| 5,155,202 | 10/1992 | Morita et al. | 525/507 |
| 5,190,995 | 3/1993 | Shiobara et al. | 525/481 |
| 5,298,548 | 3/1994 | Shiobara et al. | 525/481 |

FOREIGN PATENT DOCUMENTS

| | | |
|---|---|---|
| 0429667A | 6/1991 | European Pat. Off. |
| 53-000299 | 1/1978 | Japan . |
| 60-112813 | 6/1985 | Japan . |
| 63-251419 | 10/1988 | Japan . |
| 2-088621 | 3/1990 | Japan . |
| 2-091118 | 3/1990 | Japan . |
| 2-099514 | 4/1990 | Japan . |
| 3-000717 | 1/1991 | Japan . |

OTHER PUBLICATIONS

English language translation of Japanese Kokai 63-251419 (Oct. 18, 1988).

*Primary Examiner*—Frederick Krass
*Attorney, Agent, or Firm*—Millen, White, Zelano & Branigan

[57] ABSTRACT

An epoxy resin composition comprising (A) a naphthalene ring-containing epoxy resin, (B) a specific phenolic resin preferably in admixture with a conventional phenolic resin, especially naphthalene ring-containing phenolic resin, and (C) an inorganic filler shows good flow and cures to products having low modulus of elasticity, a low coefficient of expansion, high Tg irrespective of low stresses, and minimized water absorption. Then semiconductor devices encapsulated with the present composition remain highly reliable even after being subject to thermal shocks upon surface mounting.

10 Claims, No Drawings

EPOXY RESIN COMPOSITIONS AND SEMICONDUCTOR DEVICES ENCAPSULATED THEREWITH

This is a continuation of application Ser. No. 07/858,458, filed Mar. 27, 1992, now abandoned.

This invention relates to epoxy resin compositions having improved flow and curing into products having a low coefficient of expansion, a high glass transition temperature, low stresses, improved adhesion, and low moisture absorption and semiconductor devices encapsulated with cured products of such epoxy resin compositions.

BACKGROUND OF THE INVENTION

The mainstream of the modern semiconductor industry involves resin encapsulated diodes, transistors, IC, LSI, and super LSI. Among various resin compounds for encapsulating semiconductor devices, epoxy resin compositions comprising curable epoxy resins blended with curing agents and various additives are most widely used because they are generally improved in moldability, adhesion, electrical properties, mechanical properties and moisture resistance over the rest of thermosetting resins. The present day trend for these semiconductor devices is toward an increasingly high degree of integration and increased chip size therewith. Packages, on the other hand, are desired to be smaller and thinner in outer dimensions to meet the demands of compactness and light weight for electronic equipment. Further, as to the attachment of semiconductor parts on circuit boards, surface mounting of semiconductor parts is now often employed for reasons of increased part density on boards and reduced board thickness.

A common approach to the surface mounting of semiconductor parts is to dip entire semiconductor devices in a solder bath or to pass them through a hot zone of molten solder. Thermal shocks associated with this process cause encapsulating resin layers to crack or incur separation at the interface between the lead frames or chips and the encapsulating resin. Such cracks and separation become more outstanding if the semiconductor device encapsulating resin layers have absorbed moisture prior to thermal shocks encountered during surface mounting. Since encapsulating resin layers, however, inevitably absorb moisture in practical manufacturing steps, epoxy resin-encapsulated semiconductor devices after mounting sometimes suffer from a loss of reliability.

Therefore, there is a need for a semiconductor device encapsulating epoxy resin composition of quality capable of maintaining semiconductor devices reliable after their surface mounting on circuit boards.

SUMMARY OF THE INVENTION

The present invention has been made to overcome the above-mentioned problems of the prior art, and its object is to provide a new and improved epoxy resin composition exhibiting improved flow behavior and curing into products featuring a low coefficient of expansion, a high glass transition temperature (Tg), low stresses, and low moisture absorption.

Another object is to provide a semiconductor device encapsulated with a cured product of the epoxy resin composition which remains fully reliable after thermal shocks during surface mounting.

The inventors have found that by blending (A) a naphthalene ring-containing epoxy resin, (B) a specific phenolic resin, and (C) an inorganic filler, there is obtained an epoxy resin composition which has improved flow and cures into a product having a low coefficient of expansion, a high glass transition temperature (Tg), and low stresses as characterized by a lowering of modulus of elasticity in a temperature range above Tg. As opposed to prior art conventional epoxy resin compositions which were obtained by a method designed so as to provide low modulus of elasticity, but accompanied by such drawbacks as a lowering of Tg and a loss of strength, the epoxy resin composition as presently formulated can yield cured products having improved properties which were not found in the conventional epoxy resin compositions, that is, cured products which are free of a lowering of Tg irrespective low modulus of elasticity and absorb little moisture. The composition is moldable over semiconductor devices. In addition, semiconductor devices encapsulated with cured products of the presently formulated epoxy resin composition remain highly reliable after thermal shocks during surface mounting. Therefore, the presently formulated epoxy resin composition is applicable to the encapsulation of semiconductor devices of all types including SOP, SOJ, TSOP and TQFP types since it has quite improved properties as encapsulants for surface mounting semiconductor devices.

Based on the above finding, the present invention provides an epoxy resin composition comprising
(A) a naphthalene ring-containing epoxy resin,
(B) a phenolic resin comprising a phenolic resin of the following general formula (1), and
(C) an inorganic filler.

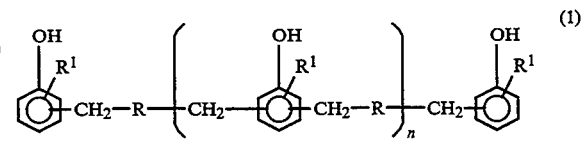

In formula (1), R is selected from the group consisting of

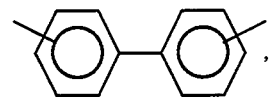

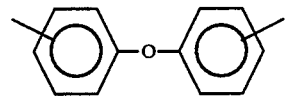

and substituted ones thereof in which some or all of the hydrogen atoms are replaced by alkyl groups having 1 to 5 carbon atoms, $R^1$ is a hydrogen atom or an alkyl group having 1 to 4 carbon atoms, and letter n is an integer of from 0 to 5.

DETAILED DESCRIPTION OF THE INVENTION

As mentioned above, the epoxy resin composition of the present invention is comprised of (A) a naphthalene ring-containing epoxy resin, (B) a phenolic resin, and (C) an inorganic filler.

Component (A) is an epoxy resin having at least one substituted or unsubstituted naphthalene ring. Illustrative, non-limiting examples of the epoxy resin having a naphthalene ring are given below.

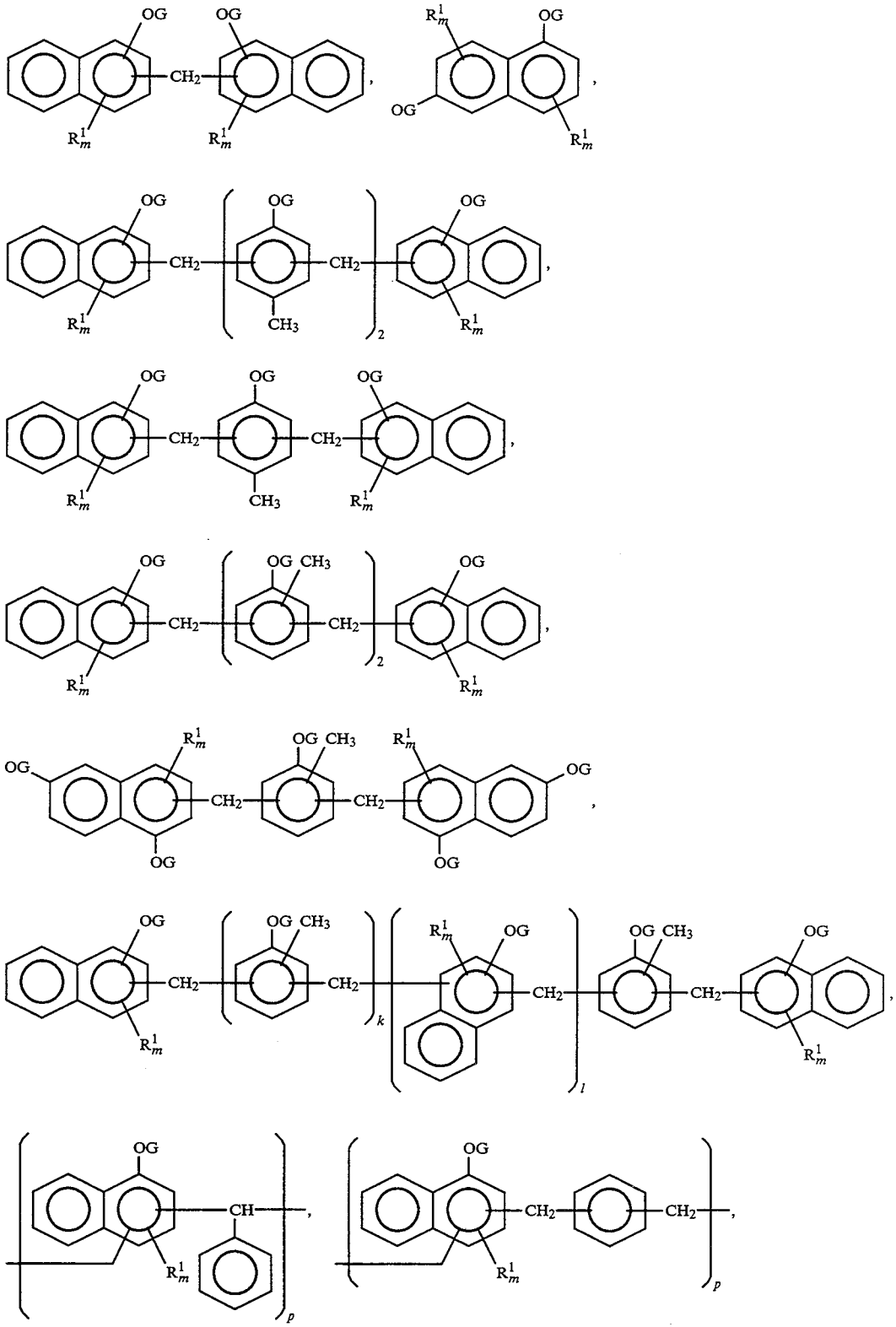

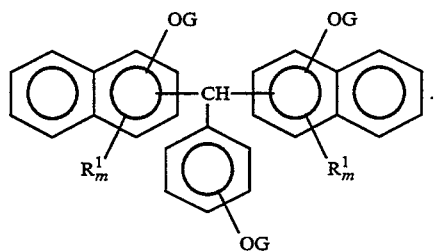

In the formulae, $R^1$ is hydrogen or a monovalent hydrocarbon group having 1 to 5 carbon atoms, OG is

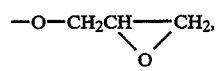

letter m is equal to 1 or 2, k, l, and p each are an integer of at least 2, more preferably 2 to 20.

Together with the above-mentioned epoxy resins having a naphthalene ring, there may be used conventional epoxy resins such as bisphenol-A type epoxy resins, phenol novolak type epoxy resins, allyl phenol novolak type epoxy resins, triphenol alkane type epoxy resins and polymers thereof, biphenyl type epoxy resins, dicyclopentadiene type epoxy resins, phenol aralkyl type epoxy resins, cycloaliphatic epoxy resins, heterocyclic epoxy resins, and halogenated epoxy resins, if desired.

Component (B) is a phenolic resin which is a curing agent for epoxy resin (A). This phenolic resin (B) should contain a phenolic resin of the general formula

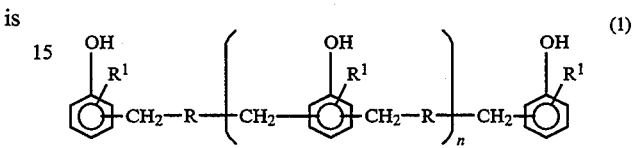

wherein R is selected from the group consisting of

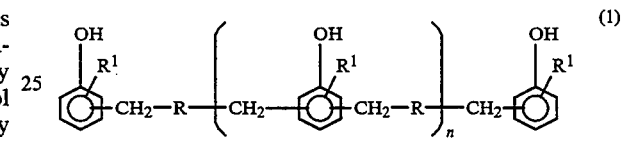

and substituted ones thereof in which some or all of the hydrogen atoms are replaced by alkyl groups having 1 to 5 carbon atoms, $R^1$ is a hydrogen atom or an alkyl group having 1 to 4 carbon atoms, and letter n is an integer of from 0 to 5.

Illustrative, non-limiting examples of the phenolic resin of formula (1) are given below.

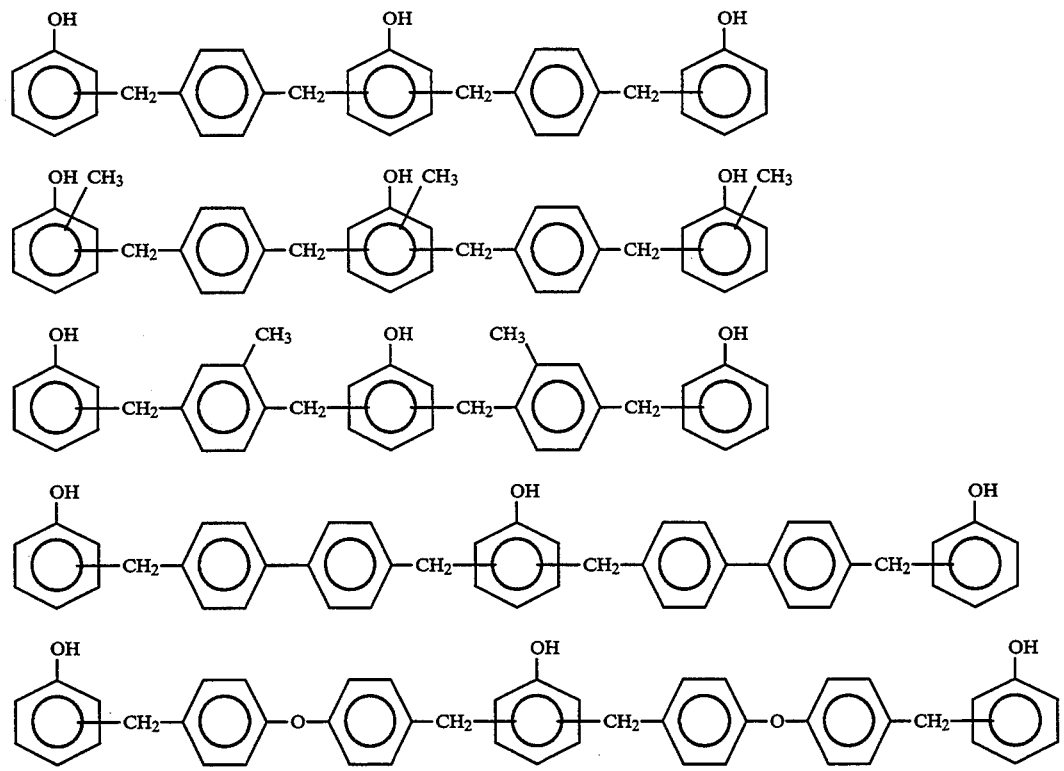

The phenolic resin of formula (1) is effective for improving crack resistance upon solder dipping after moisture absorption and reducing moisture absorption, but can sometimes lead to a lowering of glass transition temperature when used as a sole curing agent. Thus, rather than using the phenolic resin of formula (1) singly, it is desirable to use the phenolic resin of formula (1) in combination with other phenolic resins, for example, novolak type phenolic resins, resol type phenolic resins, triphenol alkane type resins and polymers thereof, and naphthalene ring-containing phenolic resins, as well as other curing agents such as amine curing agents and acid anhydride curing agents. Especially blends of the phenolic resin of formula (1) with a naphthalene ring-containing phenolic resin are best suited for minimizing moisture absorption without lowering the glass transition temperature. Examples of the useful naphthalene ring-containing phenolic resin are given below.

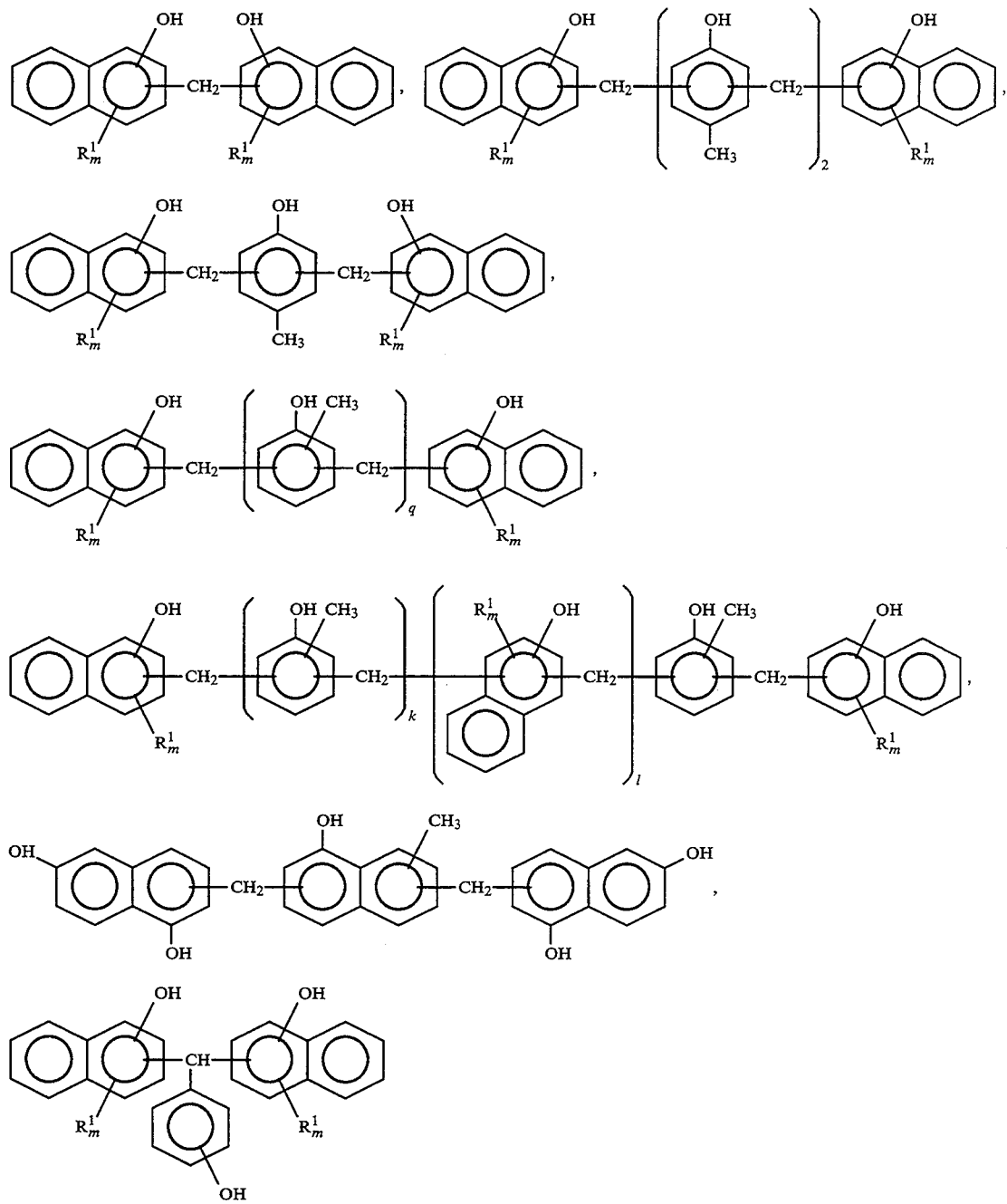

defined above and q is an integer of at least 1, more preferably 1 to 2.

Preferably, the phenolic resin of formula (1) is contained in an amount of at least 10%, more preferably about 30 to 80% by weight of the total phenolic resins as component (B).

Preferably, the content of naphthalene ring in both the epoxy resin as component (A) and the phenolic resin as curing agent (B) ranges from about 5% to about 80%, especially from about 10% to about 60% by weight based the total weight of these components. With a naphthalene ring content of less than 10% by weight, cured products would be less reduced in moisture absorption and modulus of elasticity in a temperature range above Tg and consequently, less improved in crack resistance upon thermal shocks after moisture absorption. Resins having a naphthalene ring content of more than 80% by weight would sometimes have a too high melt viscosity to disperse the epoxy resin during preparation, resulting in some disadvantages of molding and cured product properties.

Desirably, components (A) and (B) contain epoxy and phenolic hydroxyl groups in such quantities that the ratio of the quantity of epoxy group (a mol) to the quantity of phenolic hydroxyl group (b mol), a/b ranges from ½ to 3/2. Outside the range, curing property, low stress, and moisture absorption would be somewhat lost.

Component (C) is an inorganic filler which may be selected from those commonly used for epoxy resins. Examples include silicas such as fused silica and crystalline silica, alumina, silicon nitride, aluminum nitride, boron nitride, titanium oxide, and glass fibers. Among these, fused silica is preferred, and fused silica having a mean grain size of about 3 to 15 µm is especially preferred from a molding aspect. The fused silica is desirably of spherical shape for high loadings and less stresses relative to the chip surface. The inorganic filler is preferably surface treated with silane coupling agents prior to blending in order to enhance the interfacial strength between the resin and the filler.

These inorganic fillers may be used alone or in admixture of two or more. The filler is preferably used in an amount of about 100 to 1,000 parts, especially about 200 to 700 parts by weight per 100 parts by weight of the total of components (A) and (B) although the filler content is not particularly limited.

A curing catalyst may be blended in the epoxy resin composition of the invention. The curing catalyst used herein include imidazoles, tertiary amines, and phosphorus compounds. The preferred curing catalysts are mixtures of 1,8-diazabicyclo(5.4.0)undecene- 7 and triphenylphosphine in a weight ratio of from 0:1 to 1:1, especially from 0.01:1 to 0.5:1. A higher proportion of 1,8-diazabicyclo(5.4.0) -undecene -7 beyond this range would sometimes lead to a lower glass transition temperature. The amount of the curing catalyst added is not particularly limited although it is preferably added in an amount of 0.2 to 2 parts, more preferably 0.4 to 1.2 parts by weight per 100 parts by weight of the total of components (A) and (B).

The composition of the invention may further contain various well-known additives if desired. Exemplary additives include stress lowering agents such as thermoplastic resins, thermoplastic elastomers, organic synthetic rubbers, and silicones; mold release agents such as waxes (e.g., carnauba wax) and fatty acids (e.g., stearic acid) and metal salts thereof; pigments such as carbon black, cobalt blue, and red iron oxide; flame retardants such as antimony oxide and halides; surface treating agents such as silanes (e.g., γ-glycidoxy-propyltrimethoxysilane) and alkyl titanates; antioxidants; halogen trapping agents; other additives, and mixtures thereof.

The epoxy resin compositions of the invention may be prepared by mixing and agitating predetermined amounts of the necessary components uniformly, and milling the mixture in milling means preheated at 70° to 95° C., for example, a kneader, roll mill and extruder, followed by cooling and comminution. The order of mixing the components is not critical.

The compositions of the invention are advantageously applicable in encapsulating various types of semiconductor device including SOP, SOJ, TSOP, and TQFP types. The compositions can be molded by conventional methods including transfer molding, injection molding, and casting. Most often, the epoxy resin compositions are molded at a temperature of about 150° to about 180° C. for about 30 to about 180 seconds and post cured at a temperature of about 150° to about 180° C. for about 2 to about 16 hours.

The epoxy resin compositions of the invention comprising the specific components in admixture as defined above flow well and cure into low stressed products having a low modulus of elasticity (especially at temperatures above Tg), a low coefficient of expansion, a high Tg (irrespective of low stresses), and low moisture absorption. Therefore, the semiconductor devices encapsulated with the epoxy resin compositions are highly reliable even after being subject to thermal shocks upon surface mounting.

EXAMPLE

Examples of the present invention are given below together with comparative examples, by way of illustration and not by way of limitation. All parts are by weight. Examples 1–8 and Comparative Examples 1–2

Epoxy resin compositions were prepared by uniformly melt mixing the following components in a hot two-roll mill, cooling and comminuting the mixtures. The components used were an epoxy resin and a phenolic resin both shown below and used in the amounts shown in Table 1, 0.6 parts of a curing catalyst shown below, 0.5 parts of triphenylphosphine, 250 parts of spherical fused silica having a mean grain size of 15 µm and a specific surface area of 1.4 m²/g, 250 parts of spherical fused silica having a mean grain size of 10 µm and a specific surface area of 2.5 m²/g, 70 parts of spherical fused silica having a mean gain size of 1.0 µm and a specific surface area of 10 m²/g, 8 parts of antimony trioxide, 1.5 parts of carbon black, 1 part of carnauba wax, and 3 parts of γ-glycidoxypropyltri-methoxysilane.

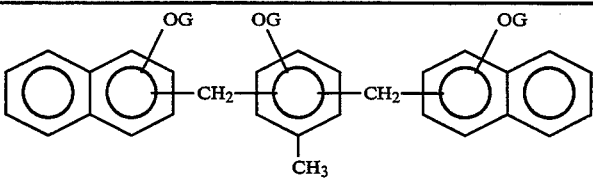

| | Epoxy resin | Epoxy equiv. | Softening point (°C.) |
|---|---|---|---|
| (I) | | 215 | 70 |
| (II) | Cresol novolak type epoxy resin EOCN-1020-65 (Nihon Kayaku K.K.) | 198 | 65 |
| (III) | Brominated epoxy resin BREN-S (Nihon Kayaku K.K.) | 280 | 80 |

|  | Phenolic resin | OH equiv. | Softening point (°C.) |
|---|---|---|---|
| (I) | [structure: four phenol OH rings linked by CH₂ groups] | 167 | 73 |
| (II) | [structure: naphthol-CH₂-phenol(CH₃)-CH₂-naphthol] | 142 | 80 |
| (III) | Phenol novolak resin TD2131 (Dai-Nihon Ink K.K.) | 110 | 85 |

Curing catalyst

It was prepared by mixing 1,8-diaza-bicyclo(5.4.0)undecene-7 and phenol novolak resin TD2131 (manufactured by Dai-Nihon Ink K. K.) in a weight ratio of 20/80, heat melting them at 130° C. for 30 minutes, and atmizing to a size of less than 50 μm.

For these compositions, the following tests (A) to (F) were carried out. The results are shown in Table 1.

(A) Spiral flow

Using a mold according to the EMMI standard, measurement was made at 180° C. and 70 kg/cm².

(B) Flexural strength and Flexural modulus

Test bars of 10×4×100 mm which were molded at 180° and 70 kg/cm² for 2 minutes and post cure at 180° C. for 4 hours tested at 215° C. according to JIS K6911.

(C) Coefficient of linear expansion (μ) and Glass transition temperature (Tg)

Test pieces of 4 mm in diameter and 15 mm long were examined in accordance with the TMA method by heating the test pieces at a rate of 5° C./min.

(D) Crack resistance upon soldering after moisture absorption

Silicon chips of 2×4×0.4 mm were bonded to SO package lead frames (42 alloy) of 4×12×1.8 mm and then encapsulated with the epoxy resin compositions by molding at 180° C. and 70 kg/cm² for 2 minutes and post curing at 180° C. for 4 hours. The packages were allowed to stand in a hot humid atmosphere at 85° C. and RH 85% for 48 and 168 hours and then immersed for 10 seconds in a solder bath at 250° C. Then the packages were disintegrated to observe the occurrence of internal cracks. Reported is the number of cracked packages/the total number of packages tested.

(E) Moisture resistance

1-M DRAM chips were bonded to SOJ frames with 20 pins and then encapsulated with the epoxy resin compositions by molding at 180° C. and 70 kg/cm² for 2 minutes and post curing at 180° C. for 4 hours. The packages were allowed to stand for 24 hours in a hot humid atmosphere at 121° C. and RH 100%, then dipped for 10 seconds in a solder bath at 260° C., and again allowed to stand for 300 hours in a hot humid atmosphere at 121° C. and RH 100%. Reported is the number of Al wire broken packages/the total number of packages tested.

(F) Water absorption

Disks of 50 mm in diameter and 2 mm thick were molded at 180° C. and 70 kg/cm² for 2 minutes and post cured at 180° C. for 4 hours. The disks were subjected to a pressure cooker test (PCT) at 121° C./100% RH for 24 hours before the water absorption (percent) was measured.

TABLE 1

|  | E1 | E2 | E3 | E4 | E5 | CE1 | CE2 |
|---|---|---|---|---|---|---|---|
| Epoxy resin (I) | 48.5 | 50.1 | 50.7 | 52.2 | 33.9 | 58.0 | 52.3 |
| Epoxy resin (II) | — | — | — | — | 15.0 | — | — |
| Epoxy resin (III) | 10.0 | 10.3 | 10.4 | 10.8 | 10.0 | 10 | 10 |
| Phenolic resin (I) | 41.5 | 18.2 | 13.1 | 22.3 | 41.1 | — | — |
| Phenolic resin (II) | — | 21.5 | 25.8 | — | — | — | 37.7 |
| Phenolic resin (III) | — | — | — | 14.7 | — | 32.0 | — |
| Spiral flow, inch | 38 | 34 | 32 | 33 | 36 | 37 | 30 |
| Flexural strength, kg/mm² | 1.6 | 1.7 | 1.9 | 1.8 | 1.6 | 1.7 | 1.9 |
| Flexural modulus, kg/mm² | 85 | 96 | 100 | 95 | 80 | 160 | 150 |
| Tg, °C. | 153 | 162 | 163 | 160 | 150 | 165 | 165 |
| μ, 10⁻⁵/°C. | 1.3 | 1.3 | 1.3 | 1.3 | 1.3 | 1.4 | 1.3 |
| Crack resistance |  |  |  |  |  |  |  |
| 85° C./85% RH, 48 hr. | 0/20 | 0/20 | 0/20 | 0/20 | 0/20 | 20/20 | 0/20 |
| 85° C./85% RH, 168 hr. | 0/20 | 0/20 | 0/20 | 0/20 | 0/20 | 20/20 | 10/20 |
| Moisture resistance | 0/20 | 0/20 | 0/20 | 0/20 | 0/20 | 7/20 | 5/20 |
| Water absorption, % | 0.32 | 0.32 | 0.33 | 0.33 | 0.34 | 0.46 | 0.42 |

As seen from Table 1, the compositions containing a naphthalene ring-containing epoxy resin, but a phenolic resin other than that of formula (1) as the curing agent, Comparative Examples 1 and 2, exhibit a high modulus of elasticity at temperatures above Tg, poor crack resistance, poor moisture resistance, and high moisture absorption.

In contrast, the compositions containing a naphthalene ring-containing epoxy resin and a phenolic resin of formula (1) as the curing agent, Examples 1 through 5, are equivalent to the comparative examples with respect to flow, flexural strength, Tg, and coefficient of linear expansion and exhibit a noticeable drop in modulus of elasticity at temperatures above Tg, minimized moisture absorption, good crack resistance, and good moisture resistance.

The compositions within the scope of the present invention are free flowing and cure to products having low modulus of elasticity, a low coefficient of expansion, high Tg, and minimized water absorption. Then the semiconductor devices encapsulated with the present compositions have improved crack resistance upon soldering after moisture absorption and moisture resistance and remain highly reliable even after being subject to thermal shocks upon surface mounting.

Although some preferred embodiments have been described, many modifications and variations may be made thereto in the light of the above teachings. It is therefore to be understood that within the scope of the appended claims, the invention may be practiced otherwise than as specifically described.

We claim:

1. An epoxy resin composition comprising (A) a naphthalene ring-containing epoxy resin of the formula

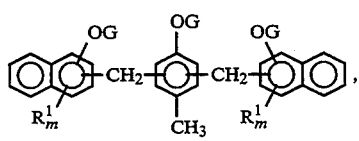

wherein $R^1$ is hydrogen or a monovalent hydrocarbon group having 1 to 5 carbon atoms OG is

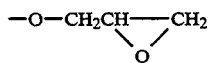

and m is 1 or 2, (B) a phenolic resin curing agent comprising a phenolic resin of the general formula (1):

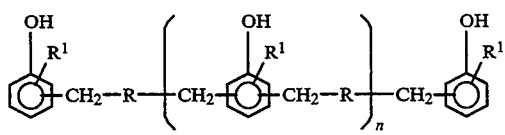

wherein R is selected from the group consisting of a ring system of the formula

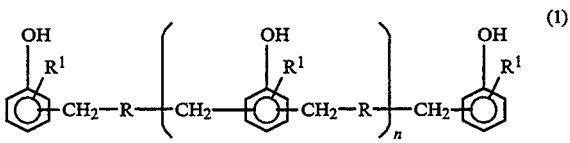

and the above ring systems substituted by alkyl groups having 1 to 5 carbon atoms, $R^1$ is a hydrogen atom or an alkyl group having 1 to 4 carbon atoms, and n is an integer of from 0 to 5, and (C) 100 to 1,000 parts by weight of an inorganic filler per 100 parts by weight of (A) and (B) combined, wherein components (A) and (B) contain epoxy and phenolic hydroxyl groups in such quantities that the molar ratio of epoxy group to phenolic hydroxyl group ranges from ½ to 3/2, and wherein the content of naphthalene rings in components (A) and (B) is about 5 to 80% by weight.

2. The epoxy resin composition of claim 1 wherein component (B) contains at least about 10%-by weight of the phenolic resin of formula (1).

3. The epoxy resin composition of claim 1 wherein components (A) and (B) contain about 10 to 60% by weight of naphthalene ring.

4. The epoxy resin composition of the claim 1 wherein 200 to 700 parts by weight of filler (C) is present per 100 parts by weight of component (A) and (B).

5. A semiconductor device encapsulated with the epoxy resin composition of claim 1 in cured state.

6. The epoxy resin composition of claim 2, wherein components (A) and (B) contain about 10 to 60% by weight of naphthalene rings; wherein components (A) and (B) contain epoxy and phenolic hydroxyl groups in such quantities that the molar ratio of epoxy group to phenolic hydroxyl group ranges from ½ to 3/2; and wherein 100 to 1,000 parts by weight of filler (C) is present per 100 parts by weight of components (A) and (B) combined.

7. A semiconductor device encapsulated with the epoxy resin composition of claim 2 in cured state.

8. A semiconductor device encapsulated with the epoxy resin composition of claim 3 in cured state.

9. A semiconductor device encapsulated with the epoxy resin composition of claim 4 in cured state.

10. A semiconductor device encapsulated with the epoxy resin composition of claim 6 in cured state.

* * * * *

UNITED STATES PATENT AND TRADEMARK OFFICE
CERTIFICATE OF CORRECTION

PATENT NO. : 5,418,266　　　　　　　　　　　　　　　　　　　　　　　　Page 1 of 1
DATED : May 23, 1995
INVENTOR(S) : Shiobara et al.

It is certified that error appears in the above-identified patent and that said Letters Patent is hereby corrected as shown below:

Column 14,
Between lines 4 and 10, delete the existing formula

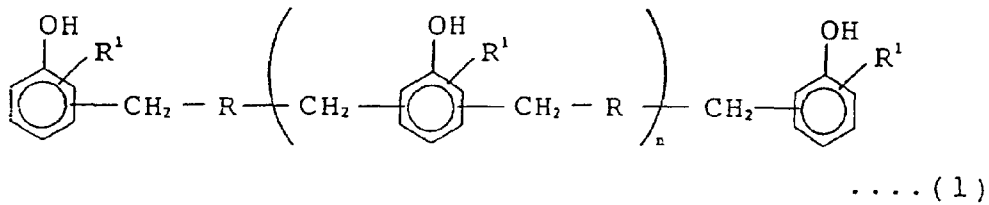

.... (1)

and replace with

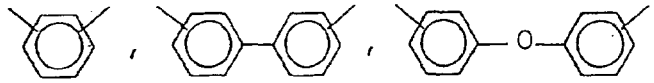

Signed and Sealed this

Twenty-third Day of July, 2002

*Attest:*

*Attesting Officer*　　　　　JAMES E. ROGAN
　　　　　　　　　　*Director of the United States Patent and Trademark Office*